United States Patent [19]
Fugaro

[11] Patent Number: 5,898,573
[45] Date of Patent: Apr. 27, 1999

[54] MICROELECTRONIC PACKAGES AND PACKAGING METHODS INCLUDING THERMALLY AND ELECTRICALLY CONDUCTIVE PAD

[75] Inventor: Anthony Salvatore Fugaro, Holly Springs, N.C.

[73] Assignee: Ericsson Inc., Research Triangle Park, N.C.

[21] Appl. No.: 08/939,394

[22] Filed: Sep. 29, 1997

[51] Int. Cl.[6] ............................. H05K 7/20; H01L 23/34
[52] U.S. Cl. .................. 361/719; 361/712; 361/720; 361/704; 361/711; 165/80.3; 257/706; 257/712
[58] Field of Search ................................. 361/711, 712, 361/719, 720, 704, 257, 818; 165/80.2, 80.3, 185; 174/16.3; 257/706–707, 712, 713, 718–719, 726–727

[56] References Cited

U.S. PATENT DOCUMENTS 4,692,839  9/1987  Lee et al. ............................... 361/386
5,403,973  4/1995  Santilli et al. ........................ 174/15.1
5,467,251  11/1995  Katchmar .............................. 361/719
5,473,511  12/1995  Reddy et al. .......................... 361/719

Primary Examiner—Leo P. Picard
Assistant Examiner—Anatoly Vorfuman
Attorney, Agent, or Firm—Myers Bigel Sibley & Sajovec, P.A.

[57] ABSTRACT

A thermally and electrically conductive (TEC) pad is disposed between a PCB and a heat sink in a cellular telephone base station. The TEC pad includes at least one aperture that overlies one or more signal vias on a ground plane of the PCB. The TEC pad apertures are larger than any underlying signal vias in order to electrically isolate the signal vias from the conductive material of the pad and the heat sink. The TEC pad allows ground vias on a PCB ground plane to ground to the heat sink.

16 Claims, 3 Drawing Sheets

MICROELECTRONIC PACKAGES AND PACKAGING METHODS INCLUDING THERMALLY AND ELECTRICALLY CONDUCTIVE PAD

FIELD OF THE INVENTION

The present invention relates generally to microelectronic systems such as cellular radiotelephone communications systems and more particularly to packaging of microelectronic systems such as cellular radiotelephone base stations.

BACKGROUND OF THE INVENTION

Cellular radiotelephone communications systems are commonly employed to provide voice and data communications to mobile units or subscribers. Cellular communications systems allocate frequencies in geographic regions referred to as cells. Cells containing equivalent groups of frequencies are geographically separated to allow different cells to simultaneously use the same frequency without interfering with each other.

Capacity limitations have been addressed by using microcells which are low power cellular transmissions that provide coverage over a smaller area. A particular application of microcell technology is an indoor cellular radiotelephone service. An indoor cellular communication system typically includes one or more mobile stations or units, one or more wall-mounted base stations, a radio control interface, and a mobile switching center. A typical indoor cellular network may have several cells with each cell being serviced by one or more wall-mounted base stations.

A typical wall-mounted base station includes a radio link interface, a power supply, and one or more communication channel transceiver printed circuit boards (PCBs) for effectuating radio communications with mobile units. Because of the microelectronic components attached thereto, these PCBs generate a large amount of heat which must be dissipated to prevent damage to the PCB and to other components within the base station. The heat-dissipation method of choice for cellular base stations utilizes a metal heat sink and relies on direct contact of the PCB with the heat sink to conduct heat away from the PCB. Fans and other cooling systems are typically not utilized because of concerns about reliability and because of the increased costs that would be added thereby.

Typically, a PCB has a copper ground plane on the face of the PCB directly contacting the heat sink to facilitate the transfer of heat to the heat sink. Blind vias are used in the PCB to connect signal traces on various layers of the PCB. Blind vias prevent the traces from contacting the ground plane and consequently shorting out with the heat sink. Because these vias do not extend to the ground plane face, the ground plane can be in direct contact with the heat sink to facilitate conducting heat from the PCB. Unfortunately, producing numerous blind vias within a PCB for cellular base stations may be expensive. Furthermore, unacceptable board warpage may occur when numerous blind vias are utilized.

PCBs with though-hole vias therein have been mounted to heat sinks with a thermal pad of electrically insulating material placed therebetween. Because the pad is thermally conductive, heat transfer to the heat sink is facilitated. However, the electrical insulation between the PCB ground plane and the heat sink can cause grounding problems for the PCB. Furthermore, the thermal pad typically does not provide adequate EMI shielding which may result in malfunctions.

SUMMARY OF THE INVENTION

It is therefore an object of the present invention to improve heat transfer between a cellular telephone base station PCB and a heat sink and provide good electrical contact for EMI shielding.

It is another object of the present invention to allow cellular telephone base station PCBs having though-hole vias to be mounted to electrically conductive heat sinks without causing PCB grounding problems.

These and other objects of the present invention are provided by a thermally and electrically conductive pad disposed between a PCB and a heat sink in a cellular telephone base station. The PCB includes a plurality of cellular base station microelectronic devices on a first face thereof and at least one conductive signal via extending to an opposite ground plane face. The thermally and electrically conductive pad disposed between the heat sink and the PCB includes a face abutting the heat sink and an opposite face abutting the PCB ground plane. The thermally and electrically conductive pad also includes an aperture therethrough that overlies one or more of the signal vias on the ground plane. The aperture is larger than any underlying signal vias in order to electrically isolate the signal vias from the conductive material of the pad and the heat sink. The PCB may also include one or more conductive ground vias extending to the ground plane. The thermally and electrically conductive pad is configured to allow the ground vias to ground to the heat sink.

The present invention is advantageous because PCBs having through-hole vias can be utilized in lieu of PCBs having blind vias. PCBs having through-hole vias are typically more reliable than PCBs having blind vias and may be less expensive to manufacture. Furthermore, PCBs having through-hole vias are less likely to warp than PCBs having blind vias. Because the pad positioned between the PCB and heat sink is electrically conductive, ground traces on the PCB can be adequately grounded to the heat sink to ensure good EMI shielding as well as good thermal conductivity.

DETAILED DESCRIPTION OF THE INVENTION

Figure 1:
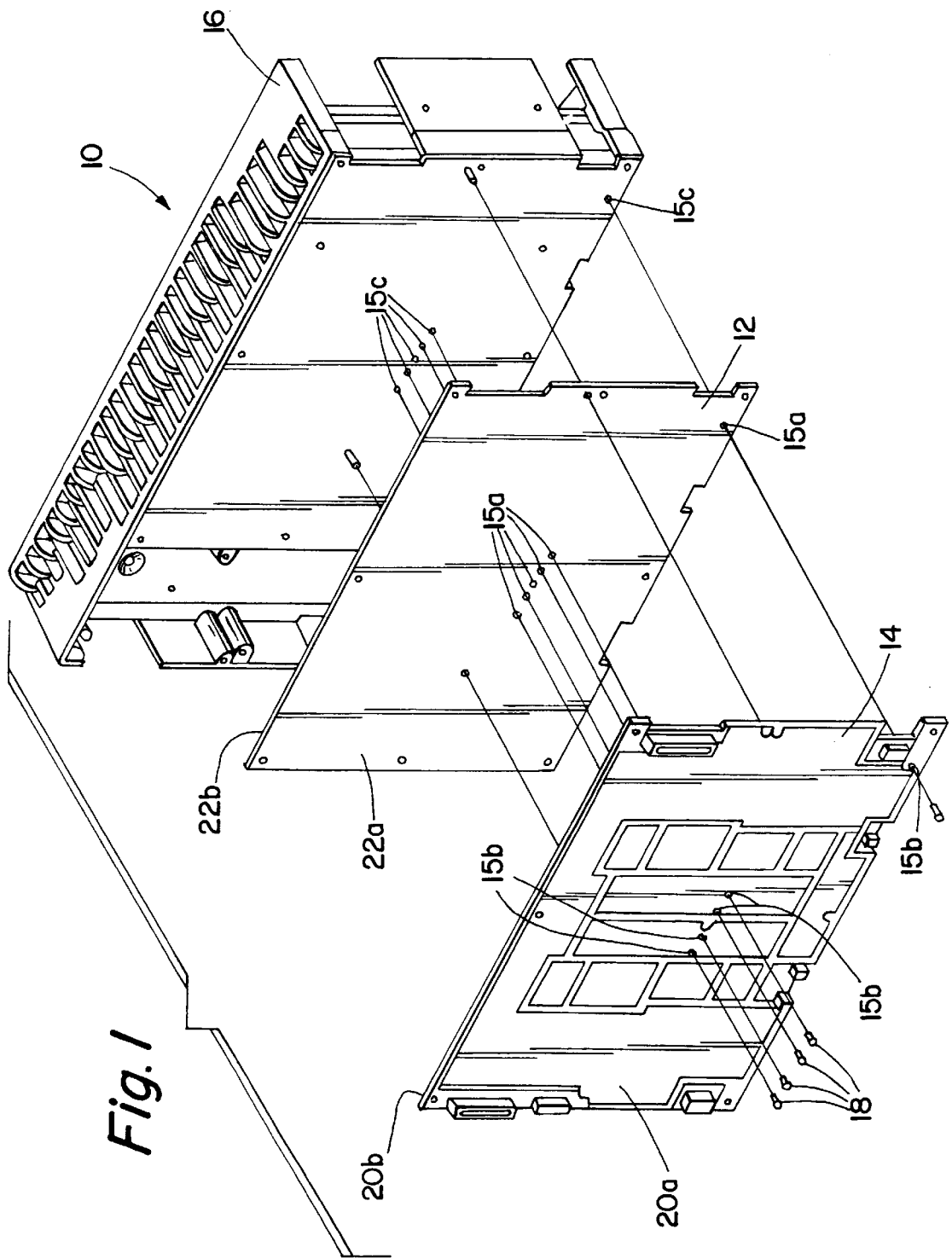
FIG. 1 is an exploded perspective view of a wall-mounted cellular telephone base station illustrating a configuration of a thermally and electrically conductive pad between a PCB and a heat sink.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Referring now to FIG. 1, a cellular telephone base station assembly 10 having a thermally and electrically conductive substrate or pad 12 (hereinafter referred to as a "TEC pad") positioned between a PCB 14 and a heat sink 16 is illustrated. The PCB 14 includes a first face 20a on which a plurality of microelectronic components (not shown) can be secured and a ground plane on an opposite second face 20b. The PCB 14 is typically a laminate formed from multiple layers of insulating material having various conductive traces thereon. Multiple conductive vias provide electrical connections between the layers.

The TEC pad 12 includes a first face 22a and an opposite second face 22b. When assembled, the TEC pad is sandwiched between the PCB 14 and the heat sink 16 such that the TEC pad second face 22b is in contact with the heat sink 16 and the TEC pad first face 22a is in contact with the PCB second face 20b. The TEC pad 12 is formed from an electrically and thermally conductive material, such as copper. The TEC pad 12 provides good electrical contact between the PCB 14 and the grounded heat sink 16 thereby minimizing EMI. The TEC pad 12 also allows heat to be conducted away from the PCB 14 to the heat sink 16 without shorting out the signal vias and any components connected thereto.

Figure 2A:
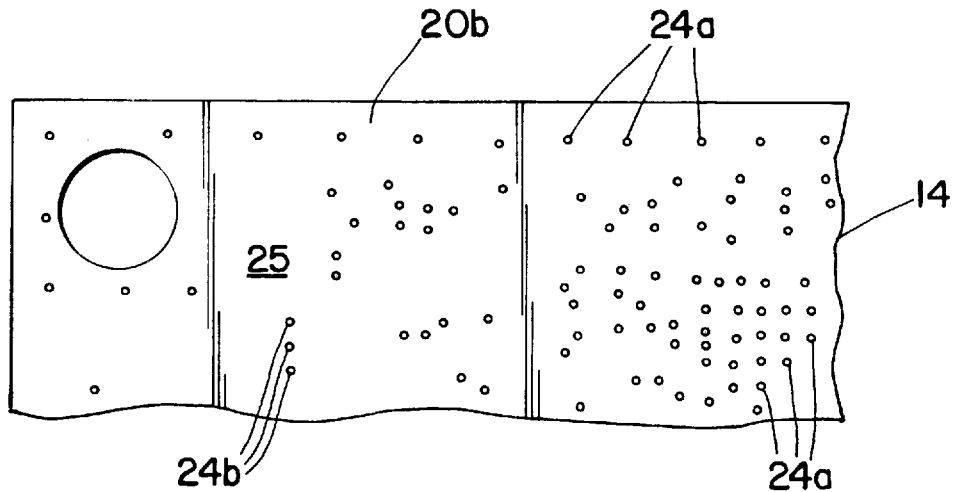
FIG. 2A is an enlarged partial plan view of the PCB in FIG. 1 illustrating a plurality of signal vias and ground vias.

In the illustrated embodiment of FIG. 1, the TEC pad 12 is similar in size and shape to the PCB 14. Apertures 15a in the TEC pad 12 align with apertures 15b in the PCB 14 and apertures 15c in the heat sink 16 and are configured to receive a plurality of fasteners 18 therethrough for securing the heat sink, TEC pad and PCB together. Also, the fasteners 18 provide sufficient clamping pressure to ensure that good contact is made between the TEC pad 12, the PCB 14 and the heat sink 16. It is to be understood that a TEC pad incorporating aspects of the present invention need not have the same configuration, shape or size of either the PCB or the heat sink to which it is attached. TEC pads of various shapes and sizes may be utilized in accordance with aspects of the present invention. Referring now to FIG. 2A, a portion of the second face 20b of the PCB 14 illustrated in FIG. 1 is shown in enlarged detail. Extending to the second face 20b of the PCB 14 are a plurality of conductive vias 24a and 24b. These conductive vias may extend either completely or partially through the PCB 14. As is known to those skilled in the art, conductive vias are typically small cylindrical openings in a PCB with conductive material, such as copper, plated on the walls thereof. Conductive vias referred to as signal vias are used to electrically connect traces between two or more layers of the PCB and are identified in FIG. 2A as 24a. Conductive vias referred to as ground vias are used to connect traces to ground and are identified in FIG. 2A as 24b.

Figure 2B:
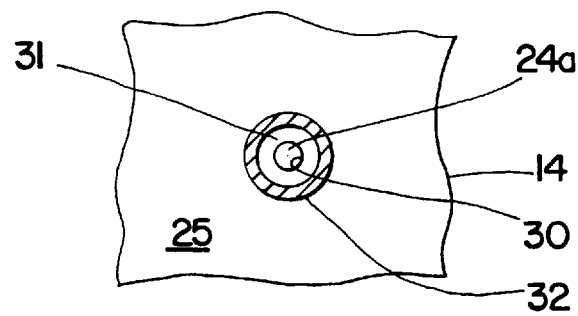
FIG. 2B is a greatly enlarged plan view of a signal via extending to the ground plane of a PCB.

The second face 20b of the PCB 14 is covered with an electrically and thermally conductive material, such as copper, which serves as a ground plane 25. Because it is conductive, the ground plane 25 facilitates conducting heat away from the PCB 14 to the heat sink 16 and allows the PCB to be grounded. As is known to those skilled in the art, a portion of the ground plane 25 is etched away around each signal via 24a extending to the ground plane 25 to electrically isolate the signal via from the ground plane. An enlarged view of a signal via 24a extending to the ground plane 25 of the PCB 14 is illustrated in FIG. 2B. The walls 30 of the signal via 24a are plated with a conductive material 31 which extends to the ground plane 25. A portion of the ground plane 25 surrounding the signal via 24a is removed such that non-conductive material 32 surrounds the signal via and thereby electrically isolates the signal via from the ground plane 25.

Figure 2C:
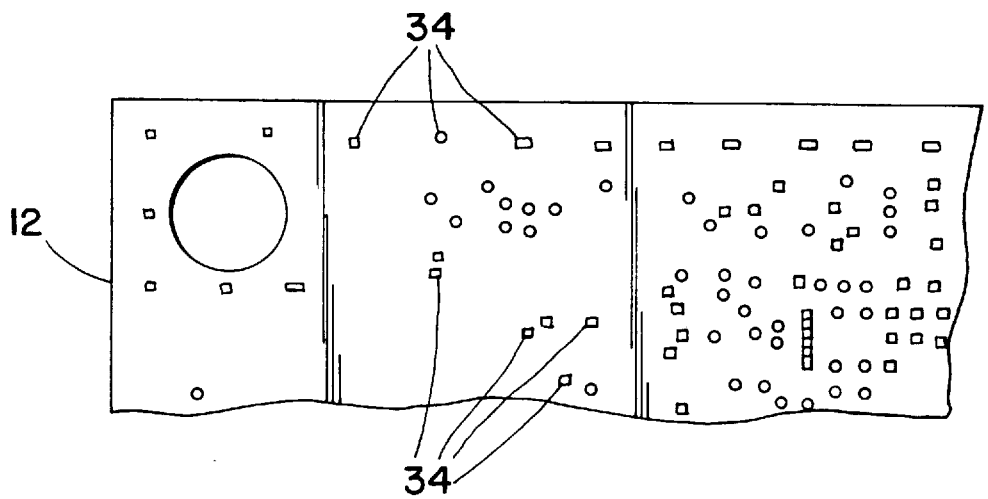
FIG. 2C is an enlarged partial plan view of the thermally and electrically conductive pad in FIG. 1 illustrating a plurality of apertures for overlying corresponding signal vias in the PCB.

Referring now to FIG. 2C, a portion of the TEC pad 12 configured to be positioned between the PCB 14 illustrated in FIG. 2B and the heat sink 16, is illustrated. The TEC pad 12 includes a plurality of apertures 34, each of which corresponds to a respective signal via 24a extending to the ground plane 25 of the PCB 14. Each aperture 34 in the TEC pad 12 is slightly larger in size than its corresponding signal via 24a. As will be described in greater detail with respect to FIGS. 3A and 3B, the larger apertures 34 in the TEC pad 12 prevent the signal vias 24a from shorting out when the ground plane 25 is in direct contact with a conductive surface, such as the heat sink 16.

Figure 3A:
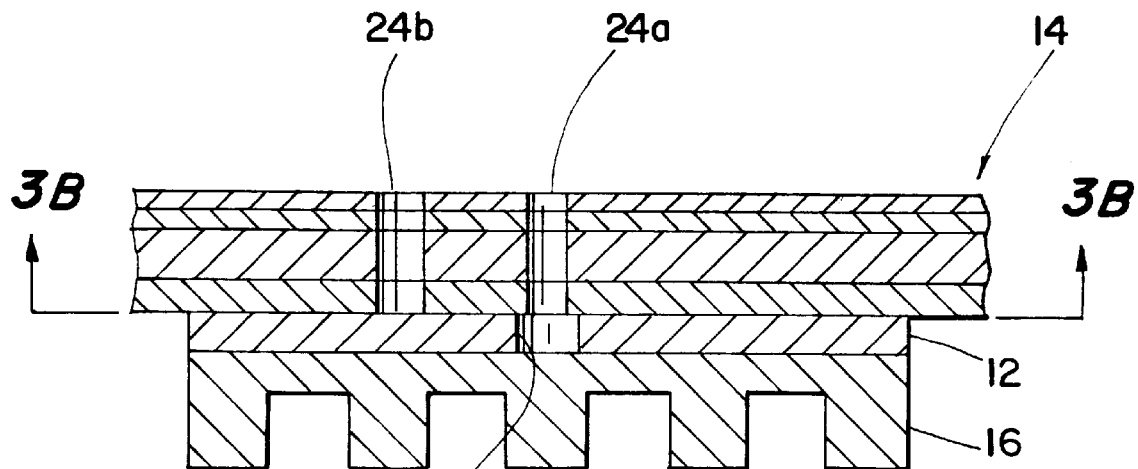
FIG. 3A is a cross-sectional view of a thermally and electrically conductive pad positioned between a PCB and a heat sink and illustrating an aperture in the thermally and electrically conductive pad overlying a signal via in the PCB.
Figure 3B:
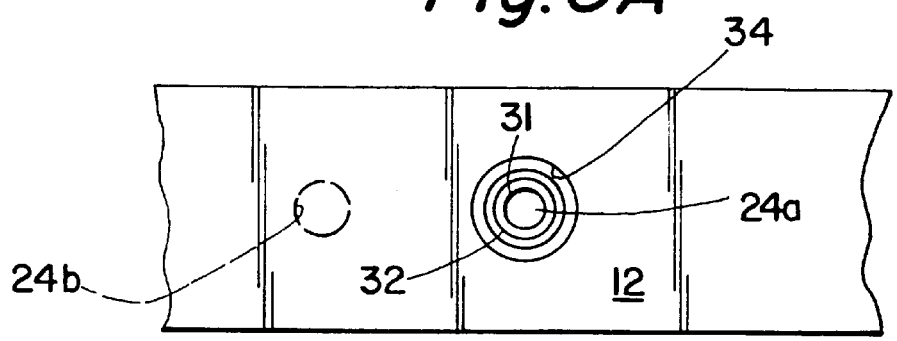
FIG. 3B is sectional view of the thermally and electrically conductive pad and PCB illustrated in FIG. 3A taken along lines 3B—3B.

Referring now to FIGS. 3A and 3B, the relationship of the TEC pad 12 to the PCB 14 when the PCB is secured to the heat sink 16 is illustrated in greater detail. The illustrated portion of the PCB 14 has a signal via 24a and a ground via 24b extending therethrough. The TEC pad 12 is disposed between the PCB 14 and the heat sink 16 and has an aperture 34 overlying the aperture of the signal via 24a. The aperture 34 in the TEC pad 12 is larger than the signal via 24a to prevent the signal via conductive material from contacting the electrically conductive TEC pad 12. Because the conductive material plated to the signal via wall extends to the ground plane 25, direct contact of the ground plane 25 to a conductive surface, such as the heat sink 16, would short out the signal via 24a and the traces connected thereto. Because the size of the TEC pad aperture 34 is larger than the signal via 24a, the signal via is electrically isolated from the TEC pad 12 and the heat sink 16.

In the illustrated embodiment, the TEC pad 12 does not have a corresponding aperture for the ground via 24b. The ground via 24b, thus, is allowed to ground to the heat sink 16 via the TEC pad 12. Accordingly, the TEC pad 12 facilitates good thermal conductivity between the PCB ground plane 25 and the heat sink 16. Furthermore, the TEC pad 12 provides good electrical contact between the PCB 14 and the heat sink 16 and allows the PCB ground vias 24b to be properly grounded.

Figure 4:
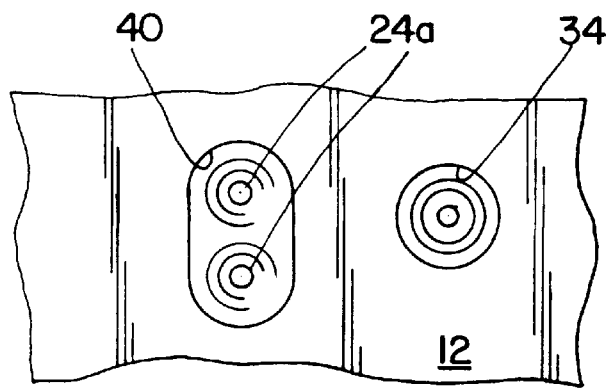
FIG. 4 illustrates an aperture in a thermally and electrically conductive pad overlying multiple signal vias.

According to another aspect of the present invention, illustrated in FIG. 4, an aperture in the TEC pad 12 may be configured to overlie a plurality of signal vias 24a in the PCB 14. Various aperture configurations, sizes and shapes may be utilized to electrically isolate multiple signal vias 24a from the conductive material of the TEC pad 12.

The present invention is not limited to the use of apertures in the TEC pad 12. A relief or cavity in the TEC pad 12 may be configured to overlie one or more PCB signal vias 24a. Preferably, the cavity has a size greater than the signal via to electrically isolate the signal via from the conductive material of the TEC pad.

Referring back to FIG. 1, a method of fabricating a cellular telephone base station according to aspects of the present invention includes providing a heat sink having a face configured to receive a printed circuit board secured thereto. A cellular telephone base station printed circuit board, including a plurality of cellular base station microelectronic devices on a first face thereof and signal and ground vias extending to an opposite ground plane face, is also provided. A TEC pad is provided with one or more apertures configured to overlie the signal vias on the printed circuit board ground plane face. The printed circuit board is secured to the heat sink face with the TEC pad disposed therebetween.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A microelectronic packaging apparatus comprising:
    a heat sink having a face;
    an electronic substrate comprising a plurality of microelectronic devices on a first face thereof and a first conductive via extending to an opposite second face; and
    an electrically conductive substrate disposed between said heat sink and said electronic substrate including a face abutting said heat sink face and an opposite face having a recessed portion therein abutting said electronic substrate second face, said recessed portion configured to overlie said first conductive via on said electronic substrate second face to electrically isolate said first conductive via from said heat sink.

2. A microelectronic packaging apparatus according to claim 1 wherein said electrically conductive substrate comprises thermally conductive material.

3. A microelectronic packaging apparatus according to claim 1 wherein said electronic substrate includes a second conductive via extending to said electronic substrate second face, said second conductive via electrically connected to said heat sink by said electrically conductive substrate.

4. A microelectronic packaging apparatus according to claim 1 wherein said electronic substrate second face is a ground plane.

5. A microelectronic packaging apparatus according to claim 1 wherein said electronic substrate includes a third conductive via extending to said electronic substrate second face, said third conductive via being electrically isolated from said heat sink by said electrically conductive substrate recessed portion.

6. A microelectronic packaging apparatus according to claim 1 wherein said electronic substrate includes a plurality of conductive vias extending to said opposite second face and wherein said electrically conductive substrate includes a plurality of recessed portions each configured to overlie a respective one of said conductive vias to electrically isolate said conductive vias from said heat sink.

7. A microelectronic packaging apparatus according to claim 1 wherein said electronic substrate is a printed circuit board.

8. A microelectronic packaging apparatus according to claim 1 wherein said recessed portion is an aperture extending through said electrically conductive substrate.

9. A cellular telephone base station comprising:
    a heat sink having a face;
    a cellular telephone base station printed circuit board including a plurality of cellular base station microelectronic devices on a first face thereof and a first conductive via extending to an opposite ground plane face; and
    a thermally and electrically conductive substrate disposed between said heat sink and said printed circuit board including a face abutting said heat sink face and an opposite face abutting said ground plane face, said thermally and electrically conductive substrate including an aperture therethrough overlying said first conductive via on said ground plane face to electrically isolate said first conductive via from said heat sink.

10. A cellular telephone base station according to claim 9 wherein said printed circuit board includes a second conductive via extending to said ground plane face, said second conductive via electrically connected to said heat sink by said thermally and electrically conductive substrate.

11. A cellular telephone base station according to claim 9 wherein said printed circuit board includes a third conductive via extending to said ground plane face, said third conductive via being electrically isolated from said heat sink by said thermally and electrically conductive substrate aperture.

12. A cellular telephone base station according to claim 9 wherein said printed circuit board includes a plurality of conductive vias extending to said ground plane face and wherein said thermally and electrically conductive substrate includes a plurality of apertures, each aperture configured to overlie a respective one of said conductive vias to electrically isolate said conductive vias from said heat sink.

13. A method of fabricating a cellular telephone base station comprising the steps of:
    providing a heat sink having a face;
    providing a cellular telephone base station printed circuit board including a plurality of cellular base station microelectronic devices on a first face thereof and first and second conductive vias extending to an opposite ground plane face;
    providing a thermally and electrically conductive substrate with an aperture configured to overlie said first conductive via on said printed circuit board ground plane face; and
    securing said printed circuit board to said heat sink face with said thermally and electrically conductive substrate disposed therebetween to electrically isolate said first conductive via from said heat sink and to electrically connect said ground plane face and second conductive via to said heat sink.

14. A method according to claim 13 wherein said step of providing a printed circuit board comprises the step of providing a third conductive via extending to said ground plane face.

15. A method according to claim 14 wherein said step of providing a thermally and electrically conductive substrate comprises providing an aperture configured to overlie said first and third conductive vias on said ground plane face to electrically isolate said first and third conductive vias from said heat sink when said printed circuit board is secured to said heat sink.

16. A method according to claim 13 wherein said step of providing a printed circuit board comprises providing a plurality of conductive vias extending to said ground plane face, and wherein said step of providing a thermally and electrically conductive substrate comprises providing a plurality of apertures therein, each aperture configured to overlie a respective one of said conductive vias to electrically isolate said conductive vias from said heat sink when said printed circuit board is secured to said heat sink.

* * * * *

UNITED STATES PATENT AND TRADEMARK OFFICE
CERTIFICATE OF CORRECTION

PATENT NO. : 5,898,573
DATED : April 27, 1999
INVENTOR(S) : Anthony Salvatore Fugaro It is certified that error appears in the above-indentified patent and that said Letters Patent is hereby corrected as shown below:

Delete Claim 2 and renumber the following claims.

Claim 1, line 34, following "an electrically", please insert --and thermally--;

Claim 3, line 48, following "said electrically", please insert --and thermally--;

Claim 5, line 56, following "said electrically", please insert --and thermally--;

Claim 6, line 61, following "said electrically", please insert --and thermally--;

Claim 8, line 3, following "said electrically", please insert --and thermally--.

Signed and Sealed this

Sixteenth Day of November, 1999

Attest:

Attesting Officer

Q. TODD DICKINSON

Acting Commissioner of Patents and Trademarks